(12) United States Patent
Pertijs et al.

(10) Patent No.: US 7,391,351 B2
(45) Date of Patent: Jun. 24, 2008

(54) BITSTREAM CONTROLLED REFERENCE SIGNAL GENERATION FOR A SIGMA-DELTA MODULATOR

(75) Inventors: Michiel A. P. Pertijs, Delft (NL); Kofi A. A. Makinwa, Delft (NL); Johan H. Huijsing, Schipluiden (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/628,126

(22) PCT Filed: May 25, 2005

(86) PCT No.: PCT/IB2005/051716

§ 371 (c)(1),
(2), (4) Date: Nov. 28, 2006

(87) PCT Pub. No.: WO2005/117269

PCT Pub. Date: Dec. 8, 2005

(65) Prior Publication Data

US 2007/0229331 A1    Oct. 4, 2007

(30) Foreign Application Priority Data

May 28, 2004    (GB)    ................................. 0411884.0

(51) Int. Cl.
*H03M 3/00*    (2006.01)
(52) U.S. Cl. ........................................ 341/143; 341/155

(58) Field of Classification Search ................. 341/143, 341/172, 44, 155
See application file for complete search history.

(56) References Cited

U.S. PATENT DOCUMENTS 6,369,733 B1 *   4/2002   Tucker et al. ............... 341/143
6,567,025 B2 *   5/2003   Schreier et al. ............. 341/143

OTHER PUBLICATIONS

Pertijs M A et al: "A Sigma-Delta Modulator With Bitstream-Controlled Dynamic Element Matching"; Solid-State Circuits Conf. 2004; ESSCIRC 2004; Proceeding of the 30$^{th}$ European Leuven; Belgium Sep. 21-23, 2004; Piscataway NJ USA; IEEE US Sep. 21, 2004; pp. 187-190.
Bakker A Ed—Institute of Electrical and Electronics Engineers: "CMOS Smart Temperature Sensors—An Overview"; Proceedings of IEEE Sensors 2002 Orlando FL; Jun. 12-14, 2002; IEEE International Conf. on Sensor NY US.; vol. 1 of 2 Conf. 1 Jun. 12, 2002; pp. 1423-1427.

* cited by examiner

*Primary Examiner*—Brian Young
(74) *Attorney, Agent, or Firm*—Peter Zawilski

(57) ABSTRACT

When a reference signal is generated for a digital-to-analog converter in the feedback path of a sigma-delta modulator, the reference signal can contain modulated error signals, for example when the reference generator implements dynamic element matching. By controlling the reference signal generation in dependence on the bitstream output from the sigma-delta modulator, the effects of intermodulation of the reference signal with the bitstream can be reduced.

23 Claims, 9 Drawing Sheets

BITSTREAM CONTROLLED REFERENCE SIGNAL GENERATION FOR A SIGMA-DELTA MODULATOR

The present invention relates to sigma-delta modulators, particularly but not exclusively to a dynamic element matching technique for use in the precision front-end of a sigma-delta modulator.

In precision interface electronics, accuracy generally depends on the matching of on-chip components. Components that need to match are usually built up from equally sized unit elements with identical layout. To improve the matching of these unit elements beyond what is achievable with good layout, a technique known as dynamic element matching can be used. Effectively, a set of switches is used to dynamically interchange the unit elements. The chopping technique used to reduce amplifier offset can be regarded as a dynamic element matching technique, where the unit elements are the two half-circuits of a differential amplifier. Dynamic element matching takes place in a series of steps typically equal to the number of unit elements. During these steps, the input signal remains constant, while every physical unit element takes the place of every other unit element in the circuit. Thus, for each step, the circuit will have a certain error due to element mismatch, but the average error of all steps will be considerably smaller. The output of the circuit can be seen as the superposition of the desired output and residuals, i.e. an error signal from the dynamic element matching, which need to be filtered out.

Interface circuits employing dynamic element matching can be used in the front-end of sigma-delta modulators, for example, for signal conditioning or for generating a precision reference, such as required in a smart temperature sensor. Sigma-delta modulators are widely used and their principles well understood.

FIG. 1 illustrates a conventional sigma-delta modulator comprising a loop filter 1, a quantizer 2 and a feedback path including a digital-to-analog converter DAC 3, which performs digital to analog conversion based on a reference signal 4. The output of the DAC 3 is subtracted from the input signal at a summing node 5. Sigma-delta modulators act as a low-pass filter to the input signal and a high pass filter to quantization noise. The low-pass nature of the sigma-delta modulator can be used to filter out the dynamic element matching residuals.

Care has to be taken, however, if a modulated error signal such as a dynamic element matching error signal is present in the reference signal 4 supplied to the sigma-delta modulator, which may result from, for example, dynamic element matching signals in the reference itself or from cross-talk from dynamic element matching in the signal path. Since the reference is effectively multiplied by the bitstream of the sigma-delta modulator, intermodulation between the bitstream and the modulated error signal may occur. If the bitstream has frequency components at or near the harmonics of the modulated error signal, these will bring components of the error signal back to DC, so that it is not properly filtered out.

The problem is illustrated in the circuit shown in FIG. 2 that includes a single bit DAC 3. The single bit DAC is modelled as a multiplier 3 which has as its inputs the bitstream bs output from the quantiser 2 and a reference voltage $V_{ref}$ produced by a chopper amplifier 6. As a result, the reference contains chopper residuals. The chopper amplifier comprises first and second multipliers 7a, 7b and an op-amp 8. The op-amp is shown with a summing node 9 adding in an offset voltage $V_{os}$ to the reference voltage input, which represents the voltage at the output of the op-amp when the inputs are connected together. The reference signal therefore fluctuates with an amplitude $+/-V_{os}$. If the reference is chopped at a frequency $f_{SD/2}$, then the control signal $\phi_{chop}$ alternates between $-1$ and $1$ on every clock cycle. When the chopper residuals are multiplied by a bitstream that contains the same $\{-1,1,-1,1,-1,1\}$ pattern, a DC error results.

FIGS. 3a and 3b show the quantization noise of a second-order sigma-delta modulator as a function of the DC input level, for an ideal reference without chopper residuals (FIG. 3a) and for a reference with chopper residuals at $f_{SD}/2$ with an offset of 1 percent (FIG. 3b). In the latter case, quantization noise is much higher due to intermodulation.

For the case of dynamic element matching, several solutions to the intermodulation problem have been proposed in the prior art. The most straightforward solution is to clock the dynamic element matching circuitry at a frequency equal to or higher than the clock frequency $f_{SD}$ of the sigma-delta modulator, so that there is no overlap in the frequency domain of the spectral components of the bitstream, which are concentrated around $f_{SD}/2$, and those of the dynamic element matching residuals. This solution, however, requires that the loop filter 1 can handle the faster dynamic element matching residuals. For a typical switched-capacitor implementation, this requires op-amps with a larger bandwidth, resulting in an increase in power consumption.

A second solution is to clock the dynamic element matching circuitry at a much lower frequency than $f_{SD}$. This reduces the intermodulation effect, as the quantization noise in the bitstream is shaped towards $f_{SD}/2$. Essentially, it means that the dynamic element matching residuals are placed in or near the baseband of the sigma-delta modulator and need to be filtered out by the decimation filter which is used with sigma-delta modulators to reduce the sampling rate. This approach does not increase the requirements on the sigma-delta modulator, in contrast to the first solution, but an important disadvantage is that the dynamic element matching error signal is not filtered out completely and a residual error remains.

A third solution, which does not have the disadvantages of the first two, is to control the dynamic element matching using a pseudo-random clock. This spreads the energy of the dynamic element matching error signal over a wider frequency band, so that there are no peaks in its spectrum that may coincide with peaks in the spectrum of the bitstream. Frequencies close to $f_{SD}$ can be used, avoiding the residual error associated with frequencies much lower than $f_{SD}$. However, a disadvantage of this solution is an increased noise level in the signal band together with the need for additional circuitry to generate the pseudo-random signal.

Mismatch shaping techniques are known for mitigating the intermodulation problems that occur in multi-bit sigma-delta modulators when dynamic element matching is applied to the elements of the multi-bit DAC. However, the aim of these techniques is to linearize a multi-bit DAC, rather than to reduce the offset and gain errors in a single-bit DAC.

The present invention aims to address the above described problems.

According to the invention, there is provided a system for controlling a reference signal generator for a sigma-delta modulator, comprising a sigma-delta modulator for providing a bitstream from an input signal, the modulator having a feedback path including a digital-to-analog converter DAC, a reference signal generator for providing a reference signal for the DAC, the generator producing a reference signal that includes an error signal pattern and a control module for receiving the bitstream and generating a control signal for controlling the error signal pattern in dependence on the bitstream.

The reference signal generator may be configured to implement dynamic element matching, the error signal pattern resulting from the dynamic element matching, for example, the error signal pattern comprising the dynamic element matching residuals.

The reference signal generator may comprise a chopper amplifier, the error signal pattern resulting from chopping in the chopper amplifier.

The bitstream may comprise a sequence of first and second values and the dynamic element matching can be configured to assume a plurality of states, the control signal being arranged to assume separate sequences of states for each of the first and second values.

At least one of the separate sequences of states may comprise a cyclic pattern.

The system may further comprise means for setting the next state in the sequence of states to have a different value from the preceding state.

The sequence of states may comprise first and second states, and the means for setting the next state in the sequence may comprise means for switching the value of each state in the sequence between first and second values. Such switching can be performed by a flip-flop, such as a D-Type flip-flop.

The setting means may comprise a cyclic counter, where each value in the sequence is different from the previous value. The setting means may more generally be a state machine, which may be selectively enabled by the bitstream.

The system may comprise first and second state machines, each of which is selectively enabled by different values in the bitstream, so generating separate sequences of states for each of the different values in the bitstream.

Alternatively, the sigma-delta modulator may comprise an analog sigma-delta modulator having a programmable gain, wherein the control module includes first and second digital sigma-delta modulators, each of which is selectively enabled by different values in the bitstream.

By arranging the control signal to have separate sequences corresponding to each of the values in the bitstream, the control signal can be arranged so that the error signal pattern averages out for each of the values in the bitstream.

The digital-to-analog converter may comprise a single-bit DAC or may be a multi-bit DAC.

According to the invention, there is further provided a control circuit for controlling an error signal pattern in a reference signal generator for a sigma-delta modulator, the control circuit being configured to receive a bitstream from a sigma-delta modulator, and to generate a control signal for controlling the error signal pattern in dependence on the bitstream.

According to the invention, there is still further provided a method of controlling an error signal pattern in a reference signal generator for a sigma-delta modulator, comprising receiving a bitstream from a sigma-delta modulator and generating a control signal for controlling the error signal pattern in dependence on the bitstream.

By providing for the error signal pattern to be controlled by the generated bitstream, the adverse effects of intermodulation can be mitigated, so reducing DC error. Examples of implementing such control include controlling dynamic element matching circuitry, controlling chopping in a chopper amplifier and controlling digital sigma-delta modulators that provide a reference signal for an analog sigma-delta modulator.

Embodiments of the invention will now be described by way of example with reference to the accompanying drawings, in which.

Figure 4:
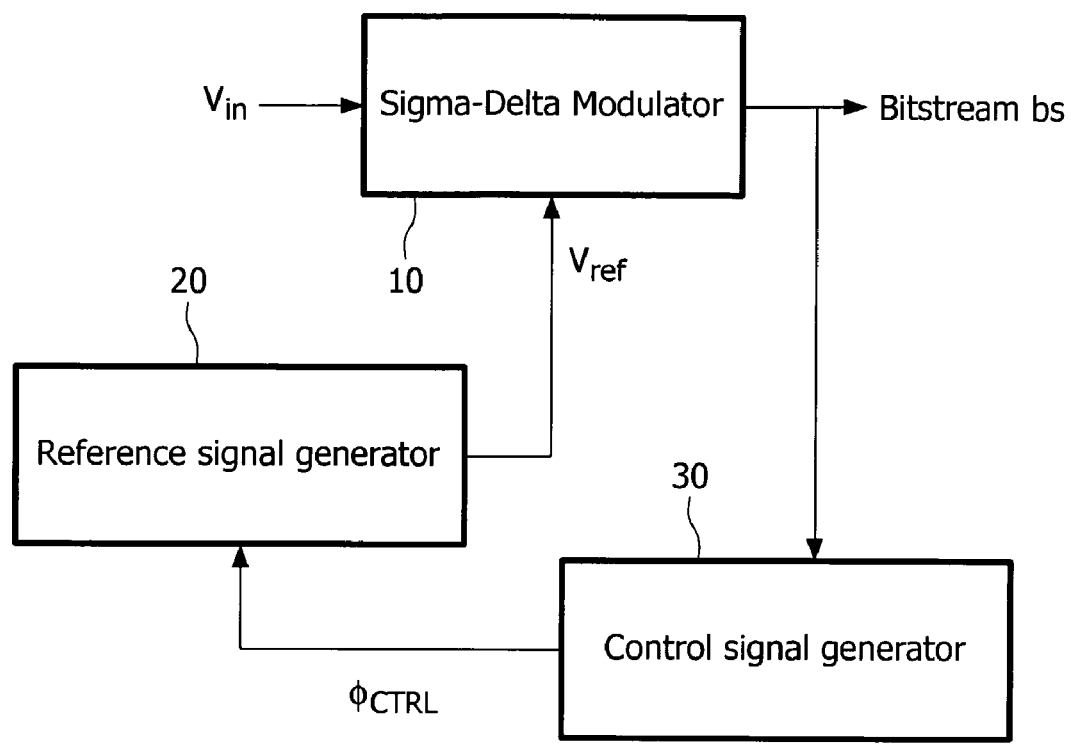
FIG. 4 is a block diagram of a circuit for implementing bitstream controlled reference signal generation according to the invention.

FIG. 4 illustrates a system according to the invention for implementing bitstream controlled generation of a reference signal for a sigma-delta modulator, comprising a sigma-delta modulator 10, a reference signal generating circuit 20 and a control signal generator 30 for providing a control signal $\phi_{CTRL}$ to control the generation of the reference signal. The control signal generator 30 uses the bitstream bs produced by the sigma-delta modulator in the generation of the control signal, as will be described in detail below.

FIG. 4 can be considered to represent the most general implementation of the invention, in which the reference generator is a module that generates a reference for the sigma-delta modulator in which the DC value is accurate, but which contains some modulated error signals. The reference generator may for example comprise a chopper amplifier or more generally include dynamic element matching circuitry.

As discussed in the introduction and referring again to FIG. 2, where the reference signal generating circuit 20 comprises a chopper amplifier, then a DC error can result when the chopper residuals are multiplied by a bitstream containing the same bit pattern. The principle behind the invention is to ensure that the chopper residuals average out for all the '0' values in the bitstream and for all the '1' values in the bitstream. An algorithm for implementing this principle will now be described in detail, first for the case of a chopping amplifier and then for the more general case of dynamic element matching of which chopping can be considered a subset.

For control of a chopping amplifier, when the current bitstream value is '0', the control signal $\phi_{chop}$ is set to the inverse of the value it had when the bitstream last had a value of '0'. If the current bitstream value is '1', the control signal $\phi_{chop}$ is set to the inverse of the value it had when the bitstream was last '1'.

For example:

| Position | 0123456789... |
|---|---|
| Bitstream | 0100110110101010111110000 |
| $\phi_{chop}$ | 0010101100110011010100101 |

So for the first '0' value of the bitstream at position '0', there is no previous value, and $\phi_{chop}$ is set to an initial value, for example, '0'. For the second '0' value in the bitstream at position 2, the previous value of $\phi_{chop}$ for a '0' value in the bitstream was '0' (at position '0'), so that the value at position 2 is set to '1'. At position 3, looking back to position 2, $\phi_{chop}$ is again set to the inverse value, namely to '0'. The next value of $\phi_{chop}$ for a '0' bitstream value will therefore be '1' (at position 6). The process continues for all other positions and similarly for the '1' values in the bitstream.

The result of this process is that the underlined values, which correspond to the 1's in the bitstream, show a 010101010 . . . pattern, as do the non-underlined values, which correspond to the 0's, so providing an averaging effect on multiplication of the reference signal with the bitstream.

Figure 1:
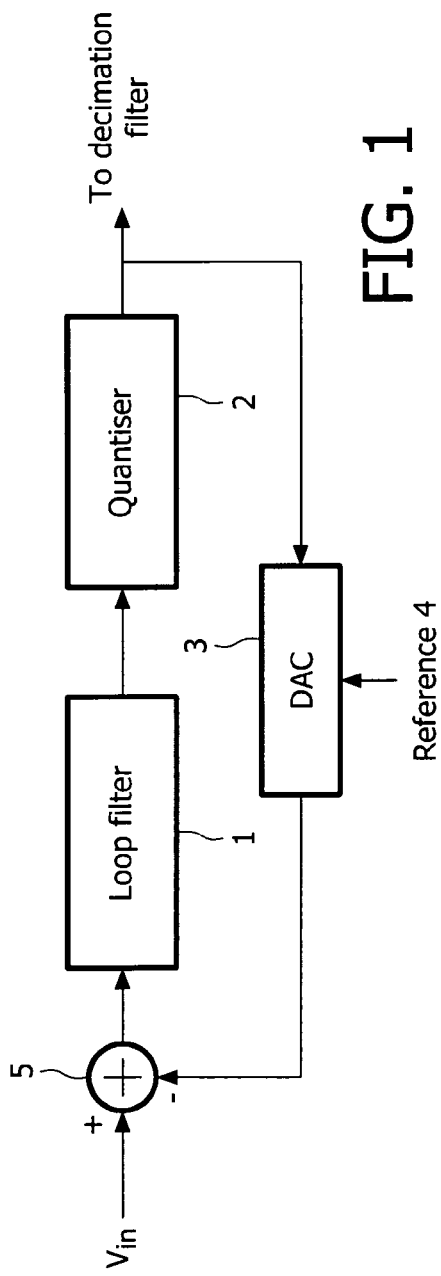
FIG. 1 illustrates the basic structure of a conventional prior art sigma-delta modulator.
Figure 2:
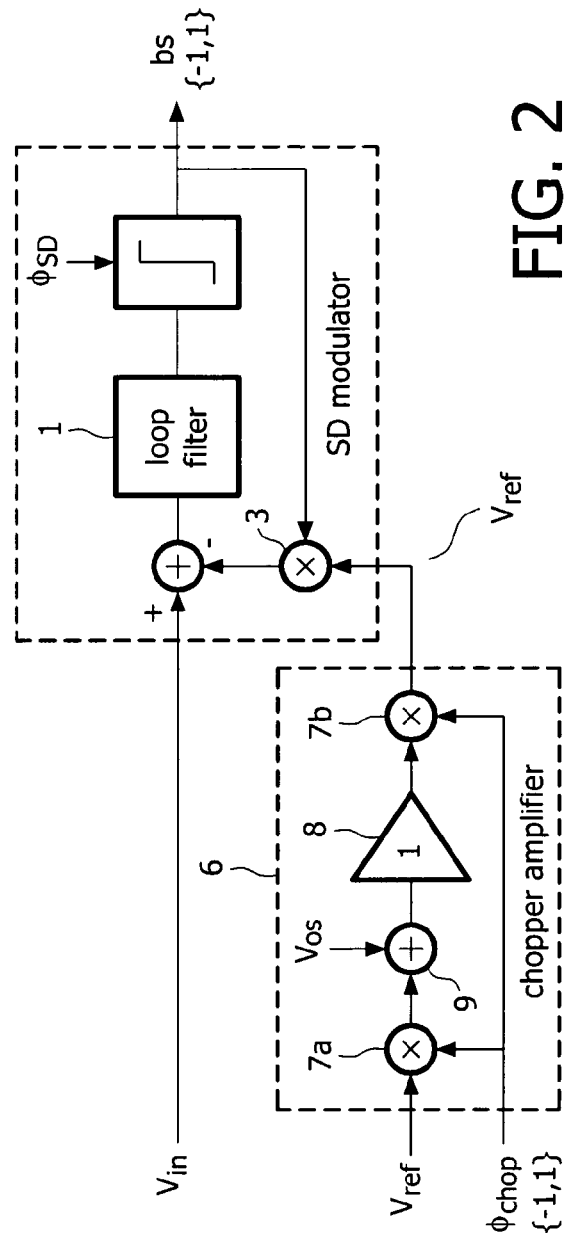
FIG. 2 illustrates a prior art sigma-delta modulator including a chopping amplifier as a reference generator.
Figure 3A:
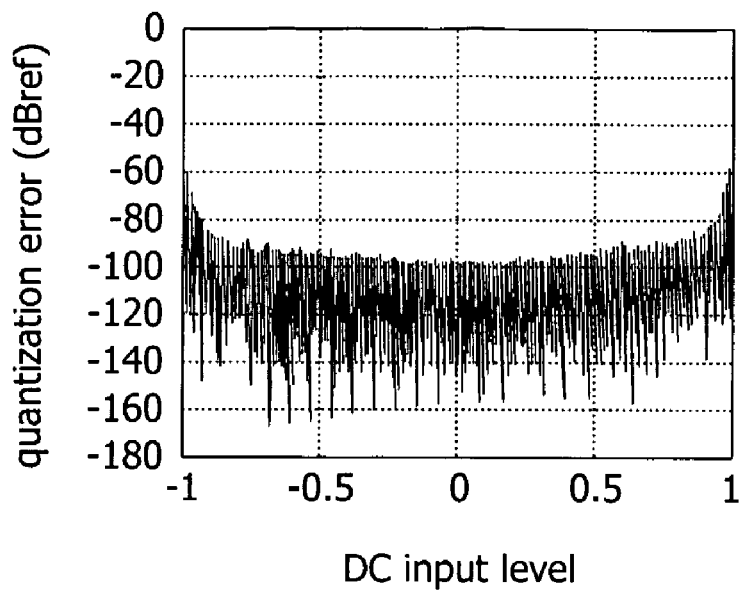
FIG. 3a is a diagram illustrating quantization error of a second order sigma-delta modulator as a function of the DC input level for an ideal reference.
Figure 3B:
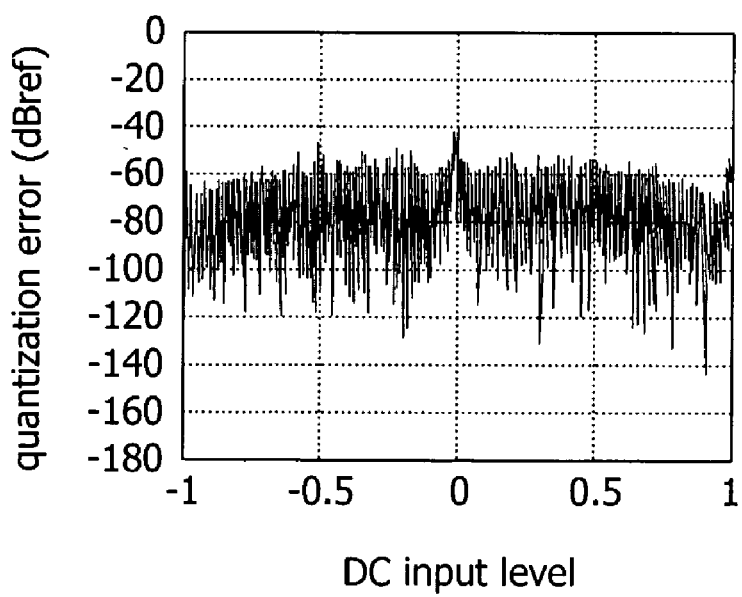
FIG. 3b is a diagram illustrating quantization error of a second order sigma-delta modulator as a function of the DC input level for a reference with a 1% offset chopped at $f_{SD}/2$.
Figure 5A:
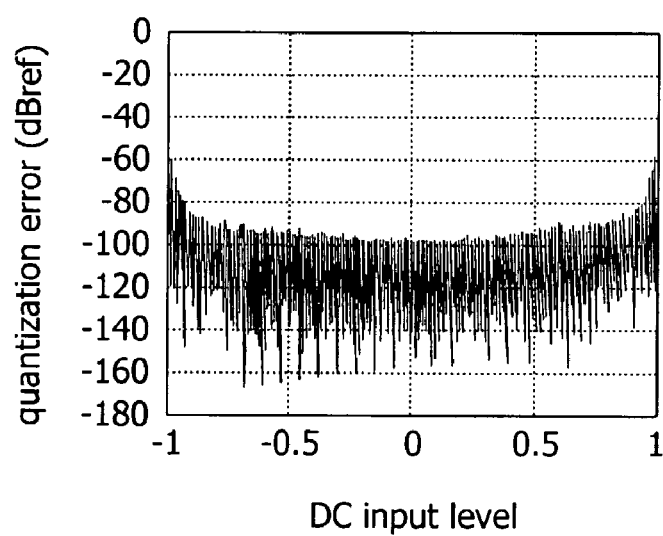
FIG. 5a is a diagram illustrating quantization error of a second order sigma-delta modulator as a function of the DC input level for an ideal reference.
Figure 5B:
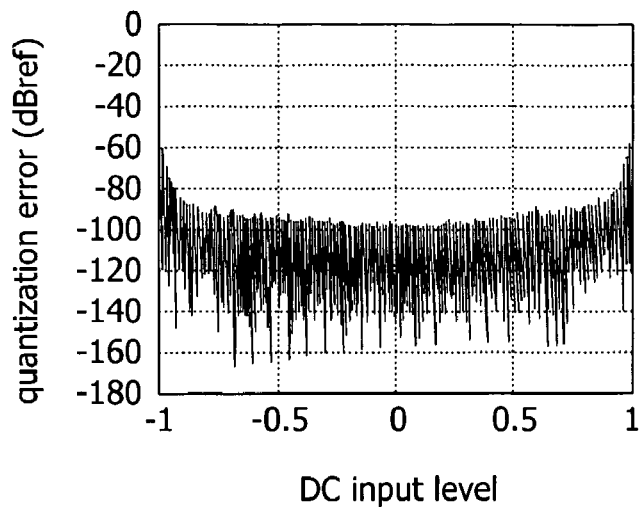
FIG. 5b is a diagram illustrating quantization error of a second order sigma-delta modulator as a function of the DC input level for a reference produced according to the invention with a bitstream controlled chopper amplifier with a 1% offset chopped at $f_{SD}/2$.

FIGS. 5a and 5b illustrate that application of this bitstream controlled chopping technique to the modulator of FIG. 2 shows that there is no appreciable increase in quantization error. FIG. 5a again shows quantization error as a function of the DC input level for an ideal reference, while FIG. 5b shows quantization error for a reference produced by a bitstream controlled chopper amplifier with a 1% initial offset according to the invention.

For the general case of multi-phase dynamic element matching, the algorithm for generating the dynamic element matching control signal ensures that the dynamic element matching residuals average out for the 0's and 1's in the bitstream. Therefore, if the bitstream value is '0' or '1', the control signal advances to the state that follows the state that was active when the bitstream was last '0' or '1' respectively. If there are, for example, 4 dynamic element matching states (0,1,2,3), the algorithm results in the following sequence of states:

| Position | 0123456789... |
|---|---|
| Bitstream | 0100110110101010111110000 |
| State | 0012123300112233012300123 |

So for the first '0' value of the bitstream at position '0', there is no previous value, and the control signal $\phi_{DEM}$ is set to an initial value, for example, state 0. For the second '0' value in the bitstream at position 2, the previous state of $\phi$ for a '0' value in the bitstream was state 0 (at position 0), so that the value at position 2 is set to state 1. At position 3, looking back to position 2, $\phi_{DEM}$ is again advanced to the next state, namely state 2. The next value of $\phi_{DEM}$ is for a '0' bitstream value will therefore be state 3 (at position 6) and will then revert to state 0 for the next '0' bitstream value (position 9). The process continues for all other positions.

The result of this process is that the underlined values, which correspond to the 1's in the bitstream, show a cyclic 01230123 . . . pattern, as do the non-underlined values, which correspond to the 0's, so providing an averaging effect on multiplication of the reference signal with the bitstream.

Figure 6:
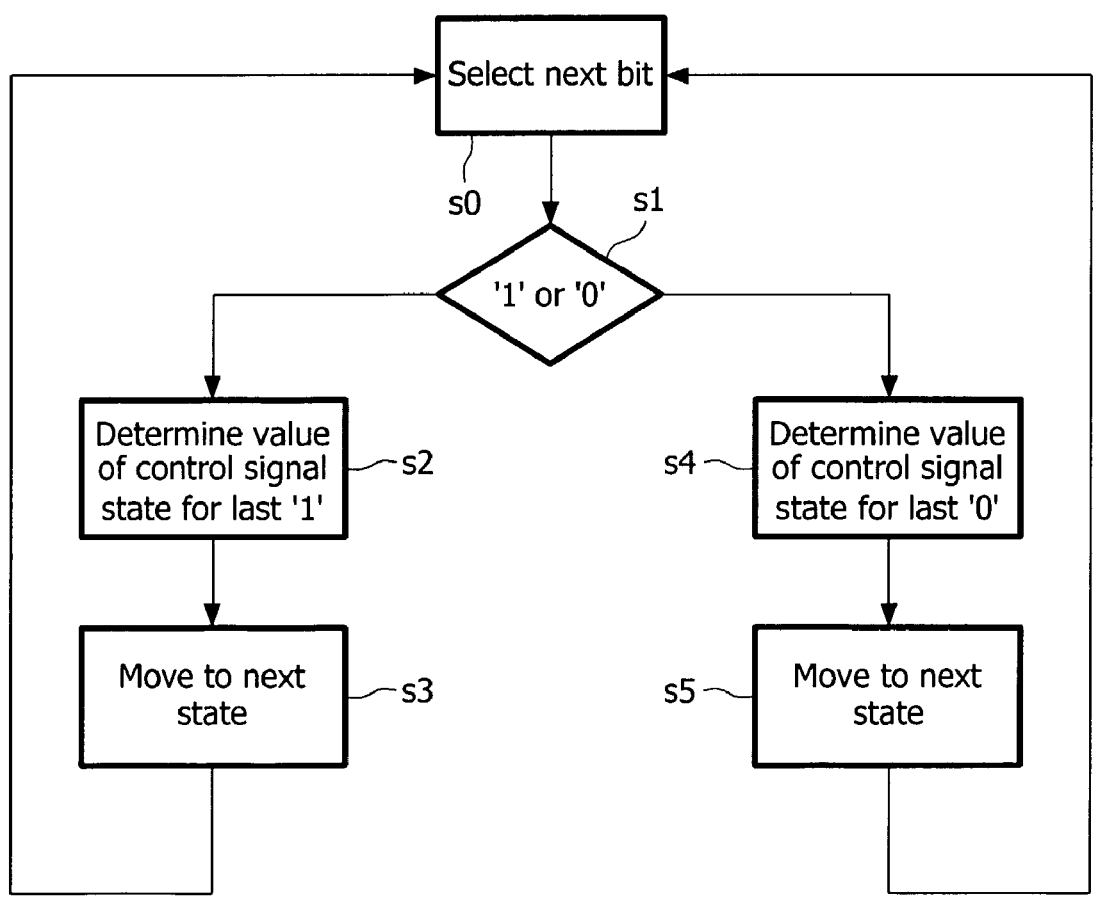
FIG. 6 is a flow diagram illustrating the basic process steps for implementing the bitstream controlled reference signal generation algorithm, which includes bitstream controlled dynamic element matching and bitstream controlled chopping according to the invention.

FIG. 6 is a flow diagram illustrating the basic process steps in implementing the bitstream controlled dynamic element matching algorithm, including bitstream controlled chopping.

The process starts with selection of the next bit of the bitstream (step s0). The algorithm determines whether the bit is a '1' or a '0' (step s1). For a '1', the algorithm determines the value of the control signal state for the previous '1' bit (step s2). The algorithm then moves the control signal to the next state (step s3). Chopping can be considered as a 2-state dynamic element matching process, so that the two states are the inverse of one another. For a '0' value in the bitstream, the same process takes place: the algorithm determines the value of the control signal state for the previous '0' bit (step 4) and moves the control signal to the next state (step s5). In both cases, the process then returns to the select the next bit (step s0).

It will be understood by the skilled person that an initialisation process takes place to set the state to an initial value the first time a '1' or '0' is encountered in the bitstream.

In comparison with the solution to the intermodulation problem described above, bitstream controlled dynamic element matching has the advantage that the dynamic element matching circuitry is clocked at most as fast as the sigma-delta modulator's clock frequency, so a faster implementation of the loop filter is not required. In addition, there are no appreciable residuals that limit the performance, as in the case of low frequency dynamic element matching, and no appreciable increase in the quantization noise, as in the case of pseudo-random dynamic element matching. As will be appreciated from the detailed implementations described below, very little extra circuitry is required in most cases.

Implementations of the invention will now be described in more detail.

Figure 7:
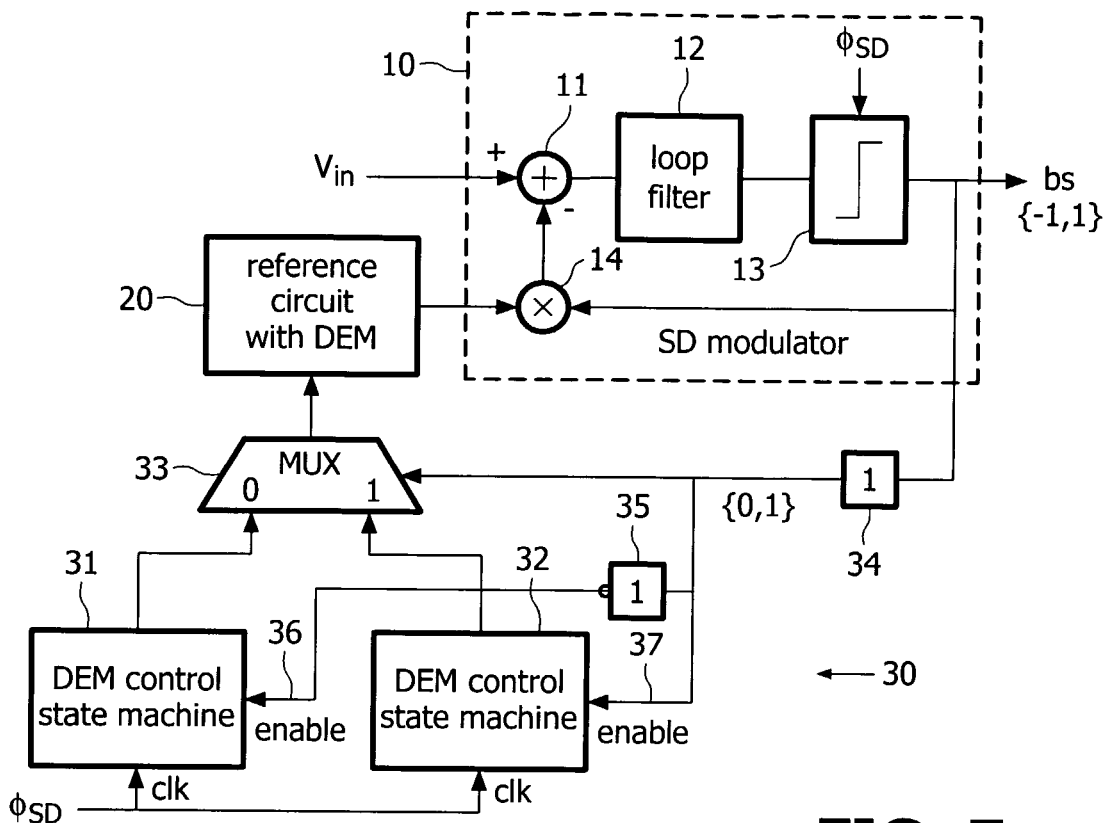
FIG. 7 is a block diagram showing an implementation of control of the general case of dynamic element matching according to the invention, using two state machines.

FIG. 7 is a block diagram illustrating an implementation of the bitstream controlled dynamic element matching algorithm for the general case of a reference generating circuit having dynamic element matching. Referring to FIG. 7, the sigma-delta modulator 10 comprises a summing node 11, a loop filter 12, a comparator 13 and a multiplier 14, representing a single-bit digital-to-analog converter.

The modulator 10 receives an input signal Vin at the summing node 11, where Vin lies in the range −Vref to Vref. The output of the summing node 11 is connected to the input of the loop filter 12 and the output of the loop filter 12 to the input of the comparator 13. The comparator is configured as a 1-bit analog-to-digital converter and is fed by a clock signal $\phi_{SD}$. The output of the comparator 13 is the modulator output, which is also connected to an input of the multiplier 14. The multiplier 14 also receives a reference signal from the reference generating circuit 20.

In one example of the invention in which multi-phase dynamic element matching is implemented in the reference generating circuit 20, the control signal generator 30 comprises first and second dynamic element matching control state machines 31, 32 fed by the same clock signal $\phi_{SD}$ as the comparator 13. The generator 30 further comprises a two input multiplexer 33 and first and second logical buffers 34, 35. The first logical buffer 34 is a non-inverting buffer while the second logical buffer 35 is an inverting buffer. The buffers are used to permit the bitstream of the modulators with a bipolar input range to be fed into a logic circuit and indicate the mapping from {−1,1} to {0,1}, i.e. a −1 at the input translates to a logical '0' at the output, a 1 at the input to a logical '1' at the output.

The outputs of the first and second state machines 31, 32 are fed as inputs to the multiplexer 33. The output of the multiplexer 33 provides the control signal for the reference generating circuit 20. The first and second state machines 31, 32 include first and second enable inputs 36, 37 respectively. The first enable input 36 receives an enable signal taken from the output of the modulator 10 and passed through the first and second logical buffers 34, 35. The second enable input 37 receives an enable signal taken from the output of the modulator 10 and passed through the non-inverting buffer 34 only. This signal is also used to control the multiplexer 33.

When the modulator output is −1, the multiplexer control input is '0', the first state machine 31 is enabled and the second state machine 32 is disabled, so that the output of the first state machine is used to control the dynamic element matching circuitry. When the modulator output is 1, the multiplexer control input is '1', the first state machine 31 is disabled and the second state machine 32 is enabled, so that the output of the second state machine is used to control the dynamic element matching circuitry. The state machines are used to implement the bitstream controlled dynamic element matching algorithm set out above to generate respective sets of values for the 0's and the 1's in the bitstream.

Figure 8:
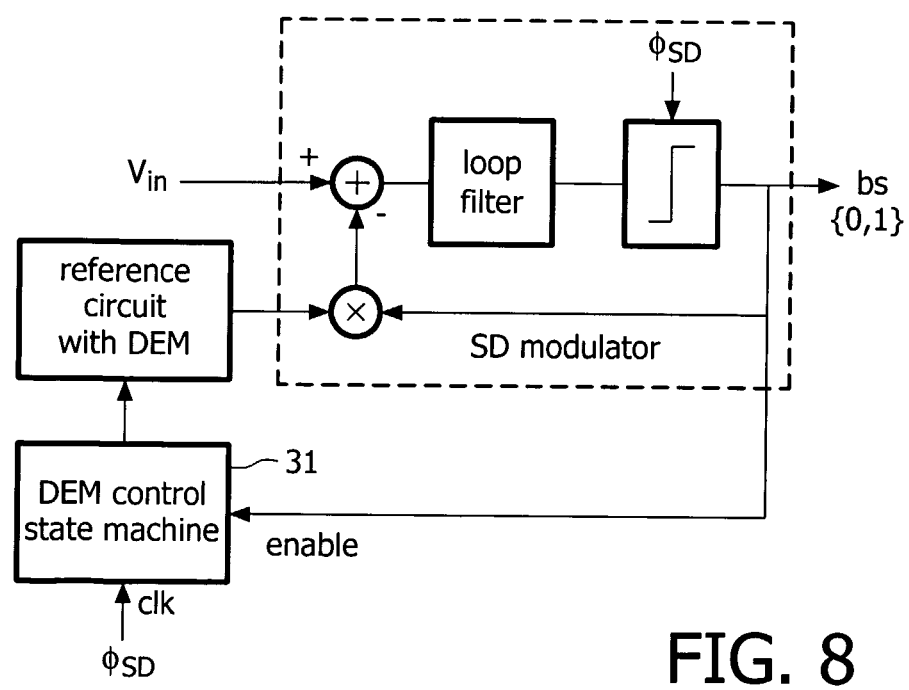
FIG. 8 is a block diagram showing an implementation of control of dynamic element matching in a reference generating circuit for a unipolar input range using a single state machine, in accordance with the invention.

For a unipolar input range, where Vin lies in the range 0 to Vref, the reference input to the modulator is not required if the bitstream value is 0. The bitstream controlled dynamic element matching algorithm can therefore be implemented with only one state machine 31, as shown in FIG. 8. The state machine is enabled every time the bitstream value is 1 and disabled every time the value is 0.

Figure 9:
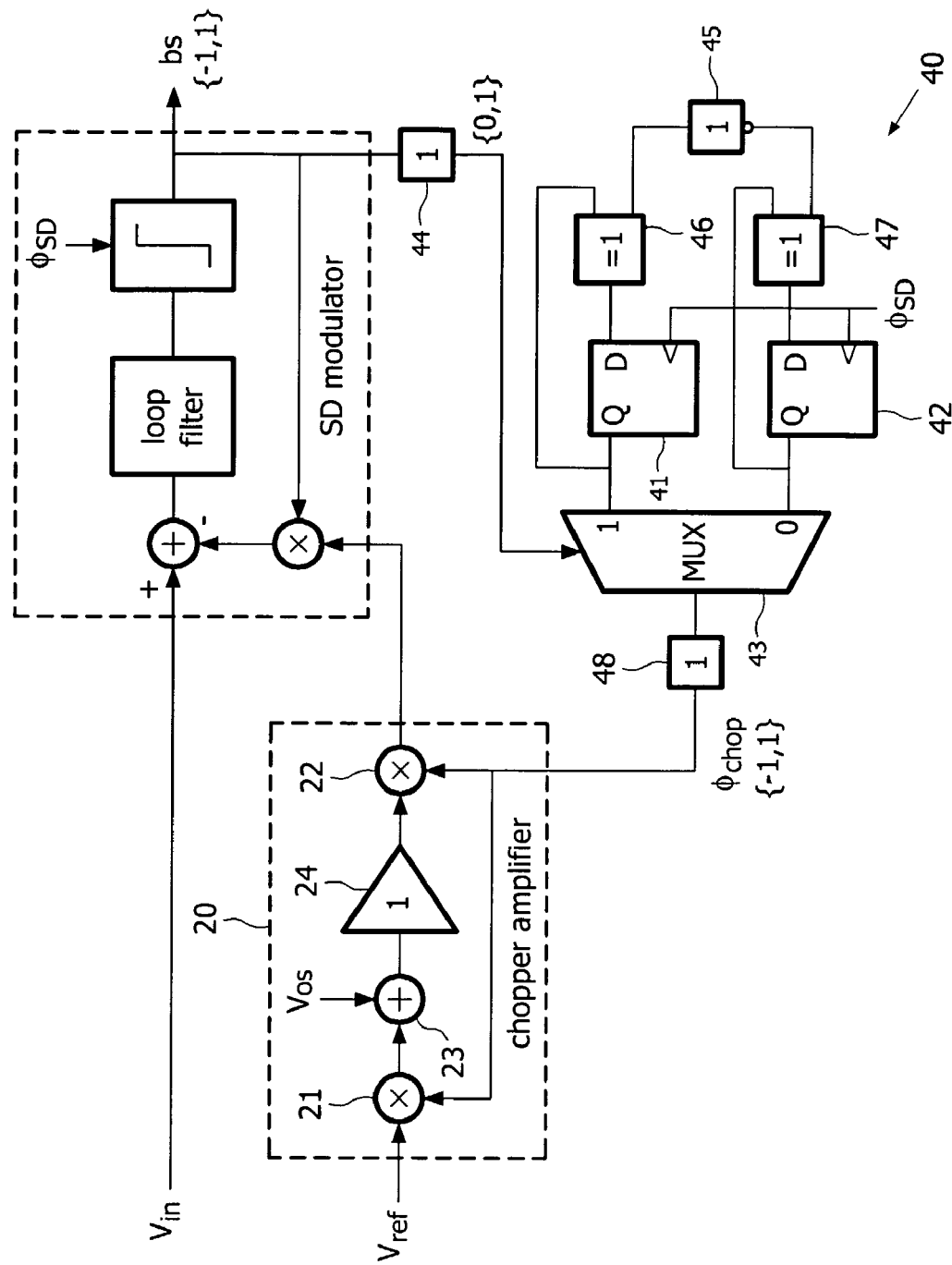
FIG. 9 is a block diagram illustrating bitstream controlled generation of a reference signal in a chopper amplifier according to the invention.

FIG. 9 illustrates the specific case of the dynamic element matching control circuitry required to implement dynamic element matching where the reference is generated by a chopper amplifier.

FIG. 9 shows a sigma-delta modulator 10, a chopper amplifier 20 and a control signal generator 40 for providing a control signal to control chopping at the chopper amplifier 20. The chopper amplifier 20 comprises first and second multipliers 21, 22, a summer 23 adding in the offset voltage $V_{os}$ and a buffer amplifier with unity gain 24. The chopping control signal generator 40 comprises first and second D-Type flip-flops 41, 42, a multiplexer 43, first and second logical buffers 44, 45, first and second exclusive-OR (XOR) gates 46, 47 and an output buffer 48. The first logical buffer 44 is a non-inverting buffer, while the second logical buffer 45 is an inverting buffer.

The output of the first non-inverting buffer 44 is connected to the multiplexer control input. A '0' at the buffer output means that the input marked '0' at the multiplexer is transmitted as the control signal $\phi_{chop}$, whereas as a '1' at the buffer output means that the input marked '1' is transmitted as the control signal. The output of the non-inverting buffer 44 is also connected to one of the inputs of the first XOR gate 46 and to the input of the inverting buffer 45. The output of the inverting buffer 45 is connected to one of the inputs of the second XOR gate 47.

The outputs of the first and second XOR gates 46, 47 are connected to the D inputs of the first and second flip-flops 41, 42 respectively, and the outputs of the first and second flip-flops 41, 42 are respectively connected to the '1' and '0' inputs of the multiplexer 43. The outputs of the first and second flip-flops 41, 42 are also respectively connected to the remaining input on the first and second XOR gates 46, 47.

The output of the multiplexer 43 passes through an output buffer 48 to transform the {0,1} logical signal format to the {−1,1} format of the chopping control signal.

The modulator receives the reference signal $V_{ref}$ from the chopper amplifier 20, which is in turn controlled by the chopping control signal $\phi_{chop}$.

The chopping control signal $\phi_{chop}$ is generated by the chopping control signal generator 40. If the current value in the bitstream is '1', the first flip flop 41 changes state on the next clock cycle. If the current value in the bitstream is '0', the second flip flop 42 changes state on the next clock cycle.

This provides a sequence of values to the chopper amplifier in accordance with the bitstream controlled chopping algorithm described above.

Considering this in more detail, when the modulator output is −1, the first buffer 44 produces a logical '0' at its output. This selects the '0' output of the multiplexer 43 and therefore the output of the second flip-flop is provided as the control signal. At the same time, the output of the inverting buffer 45 is 1, so one of the inputs to the second XOR gate 47 is 1. As a result, in accordance with standard XOR operation, the output of the second XOR gate 47 and so the D input to the second flip-flop 42 is the inverse of the last output of the second flip-flop 42. This output will become available at the Q output of the flip-flop on the next clock cycle. Therefore, when the output of the modulator is −1 again, representing a logical '0', this value is transmitted through the multiplexer 43 and the output buffer 48 as the control signal $\phi_{chop}$. When the bitstream is a logical '1', the output of the inverting buffer 45 is a logical '0', so that, in this case, the output of the second XOR gate 47 maintains the value at the output of the second flip-flop 42. The operation of the first flip-flop 41 and multiplexer 43 when the bitstream contains a logical '1' is entirely analogous to that described above.

Figure 10:
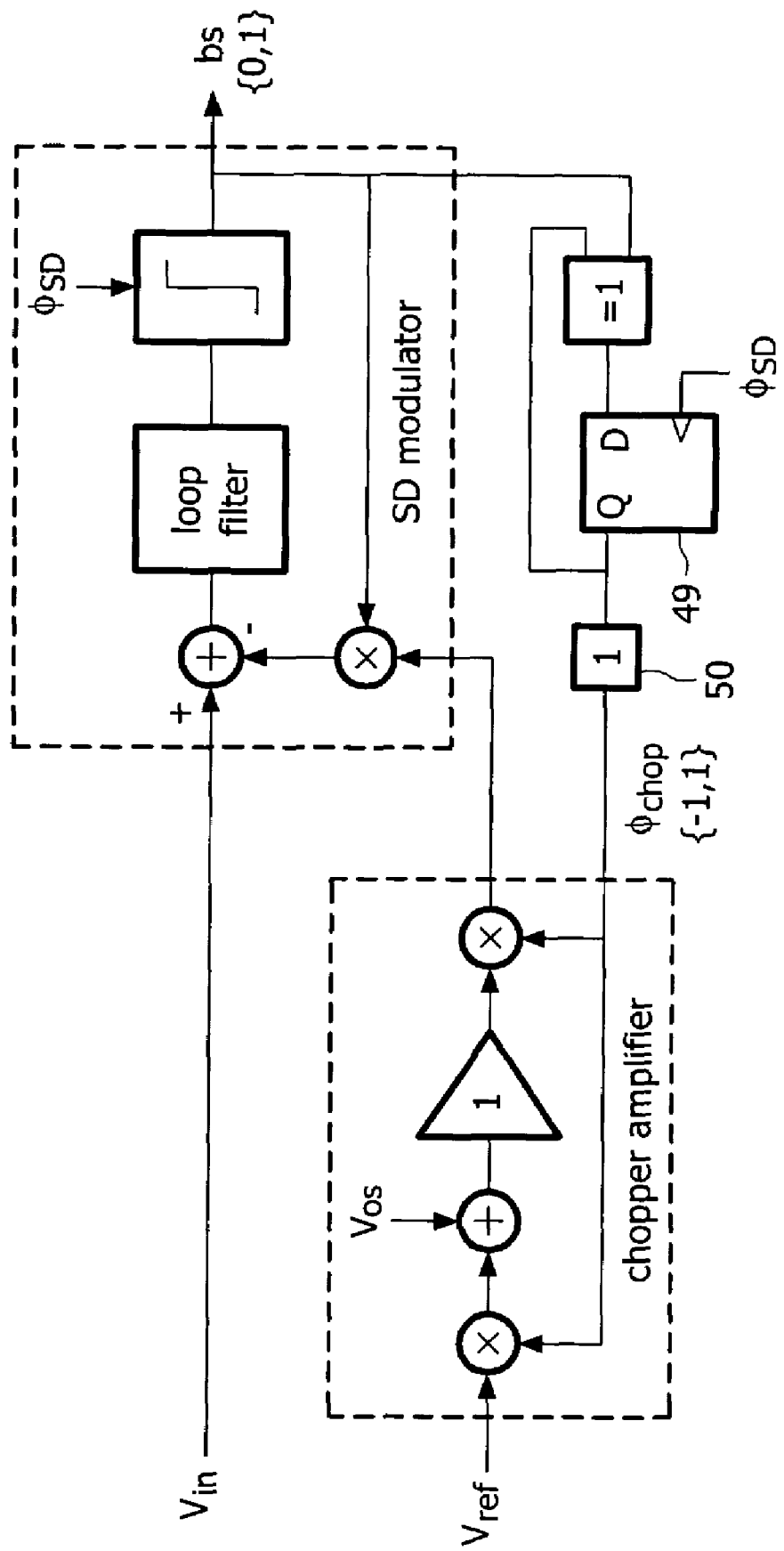
FIG. 10 is a block diagram illustrating, in accordance with the invention, bitstream controlled generation of a reference signal in a chopper amplifier for a unipolar input range.

As in the general case described above, for a modulator with a unipolar input range (0 ... Vref), the reference is not used when the bitstream value is '0'. Therefore, bitstream controlled chopping can be implemented with a single flip-flop 49, as shown in FIG. 10. In this case, a logical '0' at the input of an XOR gate 50 maintains the output of the flip-flop 49 at its previous value, whereas a logical '1' at the input to the XOR gate ensures that the next value transmitted as the control signal will be the inverse of the previous value.

The invention has been primarily described in relation to a reference generator using dynamic element matching and chopping in a chopper amplifier. However, as was noted in relation to FIG. 4, in the most general sense, the reference generator can be considered to be a module that generates an accurate DC reference value, but with associated modulated error signals, or an error signal pattern, irrespective of how that pattern is generated. These error signals need to be filtered out by the sigma-delta modulator and should not be permitted to interfere with the bitstream and so end up in the baseband. In the specific case of the reference generator using dynamic element matching, these error signals are the dynamic element matching residuals. Error signals with other origins can, however, also be prevented from interfering with the bitstream using the techniques described in this invention.

Figure 11:
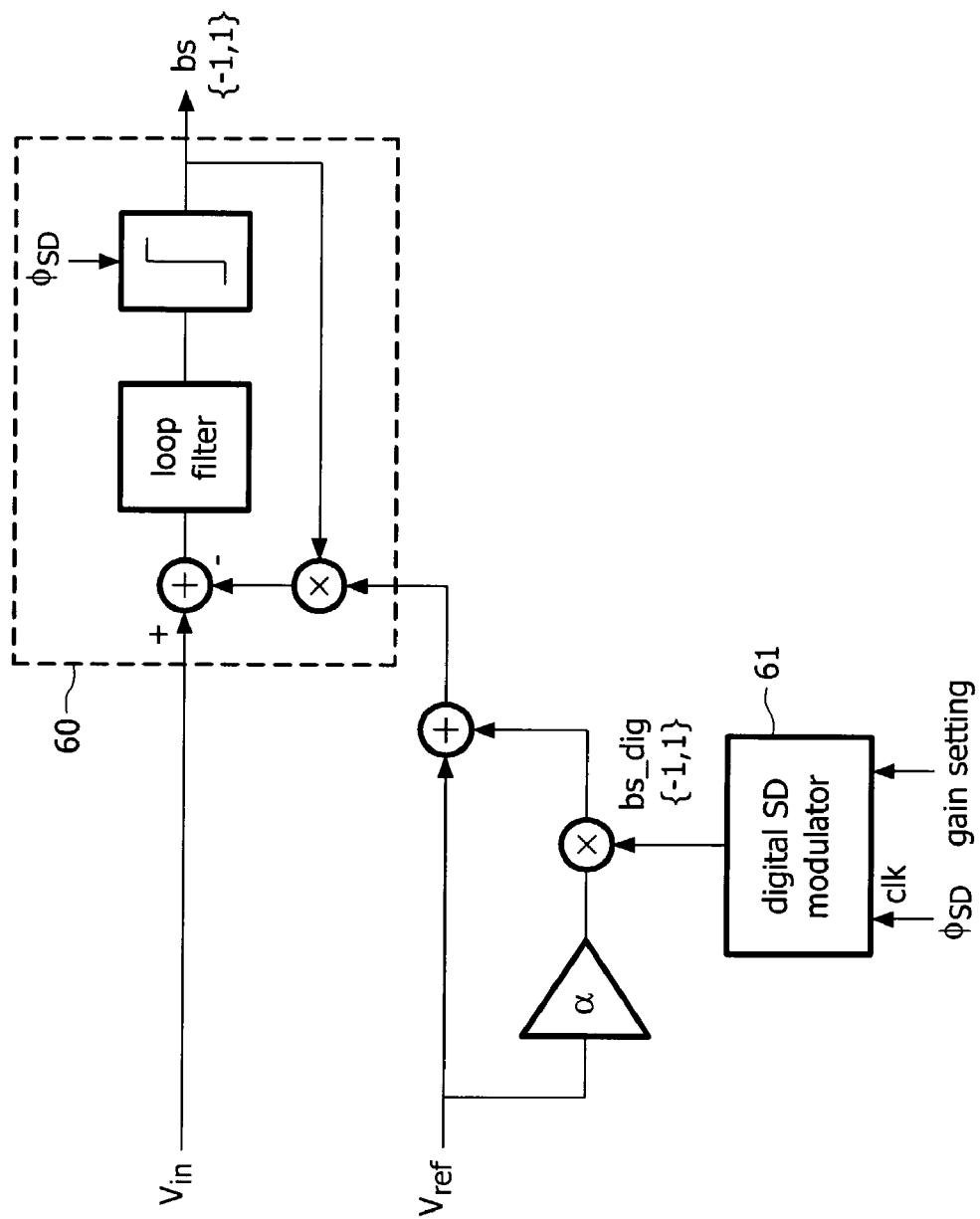
FIG. 11 is a block diagram illustrating modulation of the reference with the bitstream of a digital sigma-delta modulator.

One example of this is modulation of the reference with the bitstream of a digital sigma-delta modulator. FIG. 11 illustrates a conventional modulation scheme and shows an analog sigma-delta modulator 60, the gain of which can be programmed using a digital sigma-delta modulator 61. A fraction a of $V_{ref}$ is multiplied by the bitstream bs_dig of the digital modulator 61, so that the reference fed to the analog sigma-delta modulator 60 switches back and forth between $(1+\alpha)$ Vref and $(1-\alpha)$Vref in the pattern dictated by the bitstream of the digital modulator. Thus, by changing the input of the digital modulator, the average value of the reference of the analog modulator and hence the gain of the analog modulator can be adjusted.

The problem, as with the dynamic element matching examples, is that intermodulation occurs: the reference of the analog modulator contains the shaped quantization noise of the digital modulator, which may interfere with the bitstream bs and fall back into the baseband, so increasing the noise floor.

Figure 12:
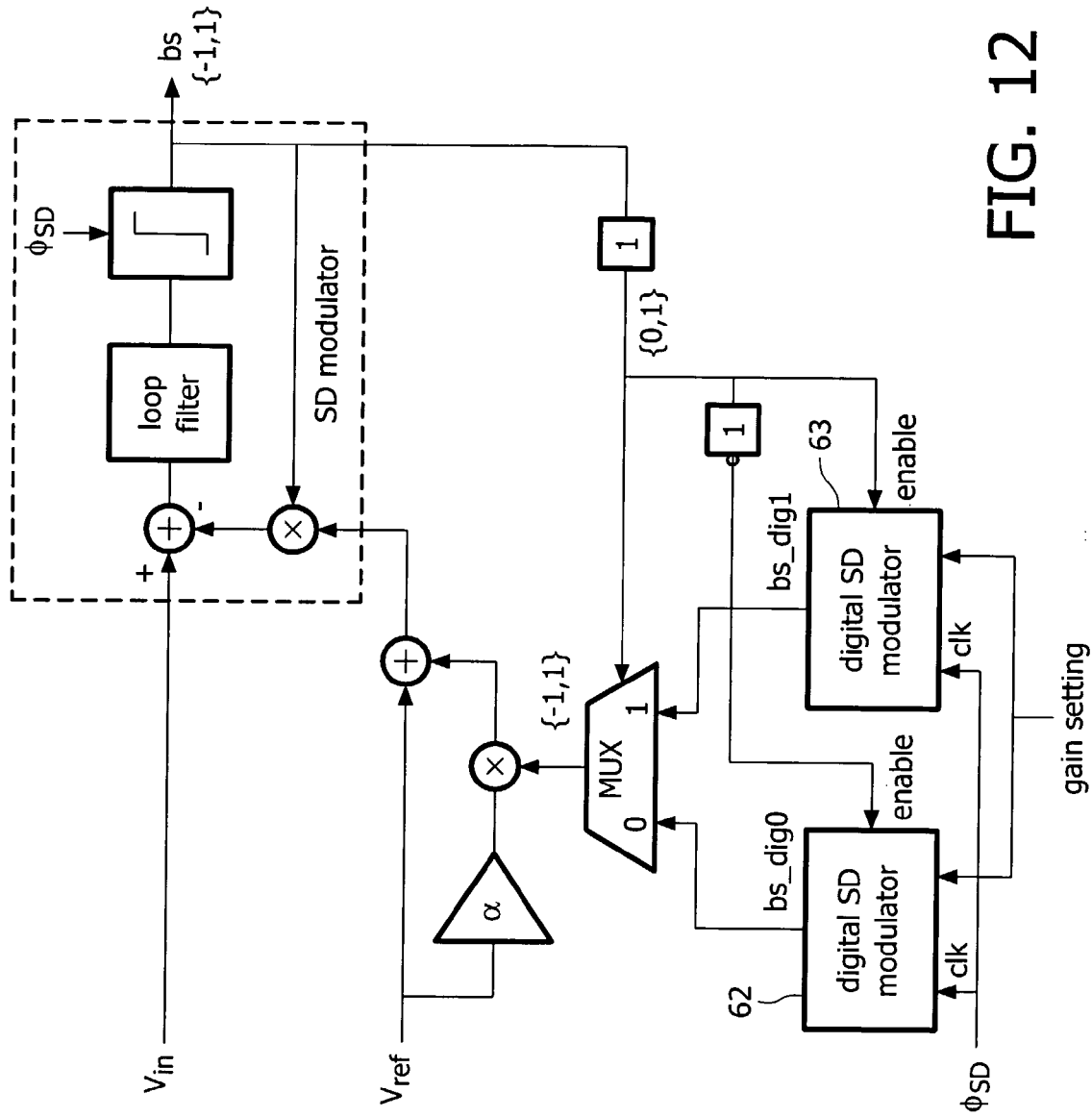
FIG. 12 is a block diagram illustrating how the circuit of FIG. 11 can be adapted to implement bitstream controlled modulation in accordance with the invention.

The solution according to our invention is shown in FIG. 12, which in structure and operation is entirely analogous to FIG. 7, except that digital modulators 62, 63 are used instead of state machines, one enabled for the 1's in the bitstream bs and one for the 0's in the bitstream bs. Thus, the quantization noise of the digital sigma-delta modulator averages out individually for the 1's and the 0's in the bitstream of the analog modulator, and no intermodulation occurs.

From reading the present disclosure, other variations and modifications will be apparent to persons skilled in the art. Such variations and modifications may involve equivalent and other features which are already known in the design, manufacture and use of sigma-delta modulators and component parts thereof which may be used instead of or in addition to features already described herein. For example, although it has been mentioned that that invention may find application in smart temperature sensors, it can be used in any form of interface circuit that employs dynamic element matching or techniques equivalent to dynamic element matching in the front end of sigma-delta modulators.

Although the invention has been illustrated using single-bit sigma-delta modulators, it can also be applied to modulators with a multi-bit DAC, in which case it may be combined with mismatch shaping of the elements of this DAC. The mismatch shaping then linearises the DAC, while the bitstream-controlled dynamic element matching eliminates offset and gain errors in the reference generating circuit.

The invention claimed is:

1. A system for controlling a reference signal generator for a sigma-delta modulator, comprising:
   a sigma-delta modulator for providing a bitstream from an input signal, the modulator having a feedback path including a digital-to-analog converter DAC;
   a reference signal generator for providing a reference signal for the DAC and configured to implement dynamic element matching that generates residuals, the generator producing a reference signal that includes an error signal pattern that includes the residuals generated by the dynamic element matching; and
   a control module for receiving the bitstream and generating a control signal for controlling the error signal pattern in dependence on the bitstream.

2. A system according to claim 1, wherein the reference signal generator comprises a chopper amplifier, the error signal pattern resulting from chopping in the chopper amplifier.

3. A system according to claim 1, wherein the bitstream comprises a sequence of first and second values and the dynamic element matching is capable of assuming a plurality of states, the control signal being arranged to assume separate sequences of states for each of the first and second values.

4. A system according to claim 3, wherein at least one of the separate sequences of states comprises a cyclic pattern.

5. A system according to claim 4, further comprising means for setting the next state in the sequence of states to have a different value from the preceding state.

6. A system according to claim 5, wherein the sequence of states comprises first and second states, and the means for setting the next state in the sequence comprises means for switching each state in the sequence between the first and second states.

7. A system according to claim 5, wherein said setting means comprises a cyclic counter.

8. A system according to claim 5, wherein said setting means comprises a state machine.

9. A system according to claim 8, wherein the state machine is selectively enabled by the bitstream.

10. A system according to claim 8, comprising first and second state machines, each of which is selectively enabled by different values in the bitstream.

11. A system according to claim 6, wherein the switching means comprises a flip-flop.

12. A system according to claim 11, comprising first and second flip-flops, each of which is selectively enabled by different values in the bitstream.

13. A system according to claim 1, wherein the sigma-delta modulator comprises an analog sigma-delta modulator having a programmable gain, wherein the control module includes first and second digital sigma-delta modulators, each of which is selectively enabled by different values in the bitstream.

14. A system according to claim 1, wherein the digital-to-analog converter comprises a single bit DAC.

15. A system according to claim 1, wherein the digital-to-analog converter comprises a multi-bit DAC.

16. A method of controlling an error signal pattern in a reference signal generator for a sigma-delta modulator, comprising:
   receiving a bitstream from a sigma-delta modulator, the bitstream includes a plurality of values;
   generating a control signal for controlling the error signal pattern in dependence on the bitstream, including sequencing through a separate series of states for each of the values in the bitstream; and
   selectively enabling a first state machine in response to a first value in the bitstream and selectively enabling a second state machine in response to a second value in the bitstream.

17. A method according to claim 16, wherein the error signal pattern arises from dynamic element matching in the reference signal generator.

18. A method according to claim 16, wherein the reference signal generator comprises a chopper amplifier, further comprising selecting an output from a first flip-flop in response to a first value in the bitstream and selecting an output from a second flip-flop in response to a second value in the bitstream, wherein each of the first and second flip-flops provides first and second sequences of values corresponding to the first and second values in the bitstream respectively.

19. A method according to claim 16, wherein the step of generating the control signal includes selectively enabling a first digital sigma-delta modulator in response to a first value in the bitstream and selectively enabling a second digital sigma-delta modulator in response to a second value in the bitstream.

20. A system comprising:
   a sigma-delta modulator for providing a bitstream from an input signal, the modulator having a feedback path including a digital-to-analog converter DAC;

a reference signal generator including a chopper amplifier, the reference signal generator providing a reference signal for the DAC, the reference signal including an error signal pattern resulting from chopping in the chopper amplifier; and a control module for receiving the bitstream and generating a control signal for controlling the error signal pattern in dependence on the bitstream.

21. A system comprising:

an analog sigma-delta modulator for providing a bitstream from an input signal, the modulator having a programmable gain and having a feedback path including a digital-to-analog converter DAC;

a reference signal generator for providing a reference signal for the DAC, the generator producing a reference signal that includes an error signal pattern; and a control module for receiving the bitstream and generating a control signal for controlling the error signal pattern in dependence on the bitstream, the control module including first and second digital sigma-delta modulators, each of which is selectively enabled by different values in the bitstream.

22. For use in a system including a sigma-delta modulator and a reference signal generator including a chopper amplifier for producing a reference signal from the sigma-delta modulator, a method of controlling an error signal pattern in the reference signal generator comprising:

receiving a bitstream from a sigma-delta modulator;

generating a control signal for controlling the error signal pattern in dependence on the bitstream;

selecting an output from a first flip-flop in response to a first value in the bitstream, and selecting an output from a second flip-flop in response to a second value in the bitstream, wherein each of the first and second flip-flops provides first and second sequences of values corresponding to the first and second values in the bitstream respectively.

23. A method of controlling an error signal pattern in a reference signal generator for a sigma-delta modulator, comprising:

receiving a bitstream from a sigma-delta modulator;

generating a control signal for controlling the error signal pattern in dependence on the bitstream, including selectively enabling a first digital sigma-delta modulator in response to a first value in the bitstream and selectively enabling a second digital sigma-delta modulator in response to a second value in the bitstream.

* * * * *